Figure 1:
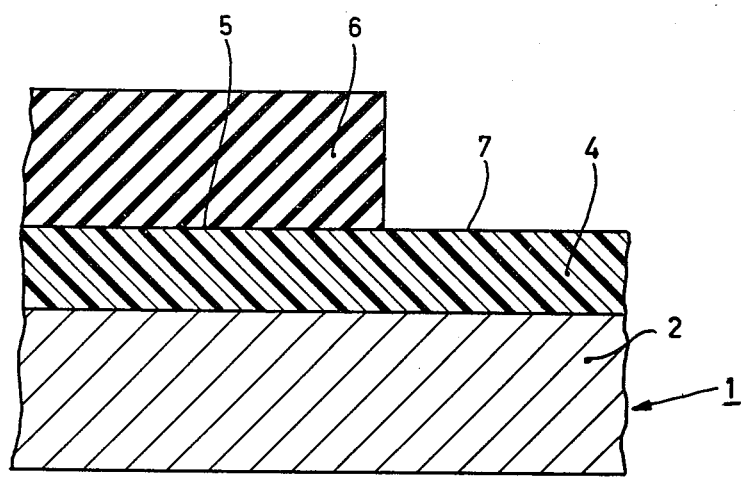

United States Patent [19]

Neukomm

[11] 4,293,375

[45] Oct. 6, 1981

[54] METHOD OF MANUFACTURING A DEVICE AND DEVICE MANUFACTURED ACCORDING TO THE METHOD

[75] Inventor: Hans-Rudolf Neukomm, Thalwil, Switzerland

[73] Assignee: U.S. Philips Corporation, New York, N.Y.

[21] Appl. No.: 47,979

[22] Filed: Jun. 13, 1979

Related U.S. Application Data

[63] Continuation of Ser. No. 810,088, Jun. 27, 1977, abandoned.

[30] Foreign Application Priority Data

Feb. 7, 1976 [NL] Netherlands ......................... 7607298

[51] Int. Cl.³ ................... H01L 21/306; C03C 15/00; C03C 25/06
[52] U.S. Cl. ................................. 156/643; 156/646; 156/657; 156/659.1; 204/192 E
[58] Field of Search ............ 156/643, 646, 657, 659.1, 156/662; 252/79.1; 204/192 EC, 192 E, 164, 298

[56] References Cited

U.S. PATENT DOCUMENTS

| | | | |
|---|---|---|---|
| 3,767,490 | 10/1973 | Alberts | 156/643 X |
| 3,839,177 | 10/1974 | Dimigen | 204/192 E |
| 3,880,684 | 4/1975 | Abe | 252/79.1 X |
| 3,919,066 | 11/1975 | Bertens | 204/192 E |
| 3,986,912 | 10/1976 | Alcorn et al. | 204/192 E |

Primary Examiner—William A. Powell
Attorney, Agent, or Firm—Thomas A. Briody; Robert T. Mayer; Paul R. Miller

[57] ABSTRACT

The invention relates to a method of plasma etching a body in which a surface of the body is covered with a photolacquer mask. According to the invention the method is characterized in that the photolacquer mask to be provided exceeds the desired dimensions of the etching pattern to be formed and furthermore that the method is carried out so that the photolacquer mask is etched more rapidly than the body. An etching profile having inclined sides is obtained.

4 Claims, 2 Drawing Figures

METHOD OF MANUFACTURING A DEVICE AND DEVICE MANUFACTURED ACCORDING TO THE METHOD

This is a continuation, of application Ser. No. 810,088, filed June 27, 1977, now abandoned.

The invention relates to a method of manufacturing a device, in which a body is subjected to an etching treatment in which parts of a surface of the body to be etched are covered with a photolacquer mask and the parts of the surface not covered by the mask are etched in a plasma which is maintained in a gas atmosphere at low pressure so as to obtain an etching pattern of the desired dimensions, and to a device manufactured by means of the method.

A method of the kind mentioned in the preamble is disclosed in U.S. Pat. No. 3,795,557 and is used, for example, in manufacturing semiconductor devices.

The advantage of plasma-etching methods as compared with etching in liquid media is that underetching of the body under the edges of the mask and hence also the variation of the etching profile determined by the underetching can be avoided.

Both in the plasma-etching process in which no underetching need occur and in etching in a liquid in which a circular etching profile occurs, the etching profile may show a right angle at its upper edge.

The formation of a right angle at the upper edge of the etching pattern has the drawback that in the subsequent provision of layers from which, for example, conductors are to be formed, interruptions and the like may occur at the sharp sides.

One of the objects of the invention is to avoid the drawback at least to a considerable extent.

The invention is inter alia based on the idea that in a plasma etching method etching patterns of uniformly inclined sides can be obtained if the etching mask is etched more rapidly from its apertures than the body to be etched.

Therefore, the method mentioned in the preamble is characterized according to the invention in that the dimensions of the surface parts to be covered with the photolacquer mask are chosen to be so as to exceed the desired dimensions of the pattern to be obtained by the width of a uniform strip, that the reaction conditions in which the plasma etching takes place are chosen to be so that the photolacquer mask is etched by the plasma more rapidly in the lateral direction than the uncovered parts of the surface of the body, and that etching is continued until the desired dimensions of the etching pattern have been reached.

It can be proved that the etching profile obtained by the method according to the invention does not have right angles at the edges of the etching pattern but that the sine of the angle $\alpha$ which forms the inclined side of the etching profile with the surface is equal to the ratio of the etching rate of the body and the lateral etching rate of the mask.

It has been found that the last-mentioned angle at the surface adjusts comparatively rapidly, the inclined etching profile changing downwards into a circular shape.

If a layer of the body is etched selectively with respect to an underlying substrate, the inclined profile after etching-through of the layer extends over the whole layer thickness.

The desired dimensions in etching layers are to be understood to mean the dimensions at the base of the etched layer.

In the case in which a layer of thickness D of the body is etched-through selectively with respect to the underlying substrate, the width b of the said strip is preferably chosen to be at least equal to D tan $\alpha$.

The last-mentioned condition indicates a strip width with which the method according to the invention can be carried out in a minimum etching time while maintaining the advantages.

This ensures a substantially constant slope throughout the etching profile.

It will be obvious that the layer of photolacquer may not be etched-through prior to the termination of the etching process.

The thickness d of the photolacquer mask is preferably chosen to be at least equal to the ratio of the double thickness D of the layer to be etched and the sine of the double angle of inclination $\alpha$.

In general, a photolacquer mask of a considerable thickness will still be present at the surface at the end of the etching process.

After etching, the remaining photolacquer mask is preferably dissolved in a process step succeeding the etching process by means of a change of the reaction conditions.

Such a dissolution of the photolacquer can be carried out easily and completely.

The method according to the invention can be carried out by means of methods conventionally used in plasma technology.

For example, photolacquer is dissolved and etched, respectively, in an oxygen-containing atmosphere and a layer to be etched, for example of polysilicon or silicon nitride, is dissolved and etched, respectively, also in a suitable atmosphere, for example an atmosphere containing halogen.

The ratio of the etching rates of the photolacquer mask and of the body is preferably controlled by the ratio of the concentrations of oxygen and halogen in the gas atmosphere.

This enables a rapid control of the ratio of etching rates which may be useful, for example, when a nonconstant inclination of the etching profile is desired.

The ratio of the etching rates of the photolacquer mask and the body is preferably controlled by the choice of the temperature of the plasma.

The activation energy of the solution of the photolacquer is often larger than that of the etching of the layer. By an increase in temperature, for example, at the end of the etching process, a certain rounding-off can still be obtained at the surface of the body.

The invention will now be described in greater detail with reference to the ensuing specific examples and the drawing.

Figure 2:
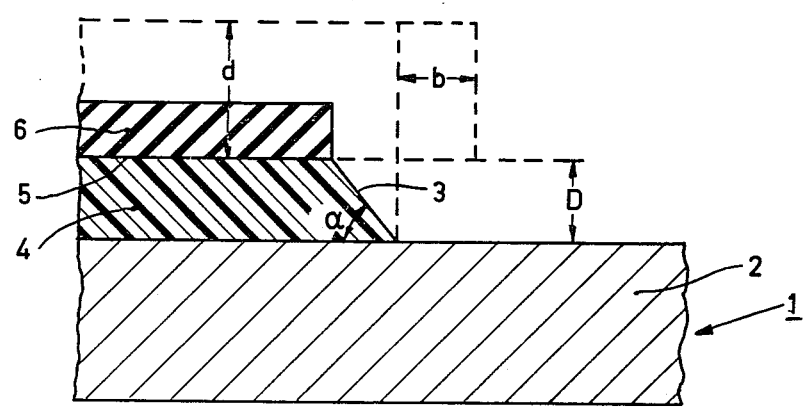

In the drawing:

FIGS. 1 and 2 are diagrammatic sectional views of a part of a semiconductor device in various stages of its manufacture by means of the method according to the invention.

FIG. 1 shows a body 1 of which parts 5 of a surface of the body that is to be etched are covered with a photolacquer mask 6 and the parts 7 of the surface of the body 1 not covered by the mask are etched in a plasma which is maintained in a gas atmosphere. By means of such an etching process an etching pattern of the desired dimensions can be obtained.

According to the invention, the dimensions of the surface parts 5 to be covered by the photolacquer mask 6 are chosen to be so that they exceed the desired dimensions of the sample to be obtained by the width of a uniform strip which width is shown by "b" (see FIG. 2).

The reaction conditions in which the plasma etching takes place are chosen to be so that the photolacquer mask is etched more rapidly by the plasma in the lateral direction than the uncovered parts of the surface of the body 1.

Etching is continued until the desired dimensions of the etching pattern have been reached.

When a layer 4 of thickness D of the body 1 is etched selectively with respect to an underlying substrate 2, then the width b of the strip 8 is chosen to be at least equal to D tan $\alpha$. $\alpha$ is the angle of inclination of the desired etching profile.

The thickness d of the photolacquer mask 6 is chosen to be at least equal to the ratio of the double thickness D of the layer 4 to be etched and the sine of the double angle to inclination $\alpha$.

The result of the etching is shown in FIG. 2 in which reference numeral 3 denotes the inclined side which encloses an angle $\alpha$ with the surface and with sin $\alpha$ equal to R/r, wherein R is the etching rate of the layer 4 and of the body 2, respectively, and r is the etching rate of the photolacquer mask 6.

The plasma used for etching is obtained in the usual manner by subjecting a low pressure gas atmosphere (0.2 to 5 Torr) present in a reactor to a capacitively or inductively generated high-frequency field.

A gas mixture containing oxygen and halogen and possibly a carrier gas, for example, argon or nitrogen, flows through the reactor. Oxygen and halogen can be present as such or as compounds, such as $CF_4$, $CClF_3$, $C_2F_6$, $C_3F_8$, $C_2ClF_5$.

Oxygen may be considered to be selective for the etching of the photolacquer mask and halogen may be considered to be selective for the etching of the layer and of the body, respectively. The ratio of the etching rates of the layer of photolacquer and the layer to be etched and the body, respectively, can hence be controlled by the ratio of the concentrations of oxygen and halogen in the reactor. This is obtained by admitting the reactive gases to the reactor in the desired ratio via needle valves and flow meters.

The reactor is previously evacuated to a pressure of approximately 0.1 Torr and the body with the photolacquer mask to be etched is heated to approximately 120° C. at approximately 2 Torr in a nitrogen plasma.

The reactor is then evacuated again to 0.1 Torr, a gas mixture of molecular oxygen and tetrafluoromethane is admitted, and etching is carried out with a power of approximately 100 W at approximately 0.5 Torr.

In order to obtain an etching pattern having inclined sides, for example, a layer of polysilicon is etched so as to obtain conductor tracks or a layer of silicon nitride is etched so as to obtain apertures for the contacting to underlying layers.

In the following table the inclinations of the etching profiles are recorded which have been obtained in the plasma etching of layers of polysilicon and silicon nitride in accordance with the ratio of the gas flows of oxygen and tetrafluoromethane.

TABLE

| Ratio of the gas flows $O_2/CF_4$ | Inclination of the etching profiles. | |
|---|---|---|
| | polysilicon | silicon nitride |
| 250/675 | — | 50° |
| 300/600 | 65° | 35° |
| 375/550 | 30° | 20° |
| 450/500 | 10° | — |

The layers were present on a substrate consisting of a silicon disc covered with a silicon oxide layer. The layers of polysilicon and silicon nitride were etched selectively with respect to the silicon oxide layer (approximately 5 to 20 times faster). p In the experiments a silicon slice of 5 cm diameter was used. If desired, a plurality of slices, for example 30 or more, may be etched simultaneously.

If polysilicon layers having an angle of inclination of $\alpha = 45°$ are etched, then, for example, D=0.5 $\mu$m, b=0.5 $\mu$m, d=1.0 $\mu$m, R=approximately 0.1 $\mu$m/minute and r=aproximately 0.15 $\mu$m/minute.

If silicon nitride layers having an angle of inclination $\alpha = 45°$ are etched, then, for example, D=0.1 $\mu$m, b=0.1 $\mu$m, d=0.2 $\mu$m, R=approximately 0.035 $\mu$m/minute and r=approximately 0.05 $\mu$m/minute.

To be on the safe side, the thickness d of the layer of photolacquer is often chosen to be from 30 to 50% larger than $2D/(\sin 2\alpha)$.

A part of the photolacquer mask remaining after etching can rapidly be removed in a plasma mainly containing oxygen.

As materials for the photolacquer mask may be used the conventional photolacquers, both positive and negative photolacquers, for example Waycoat type 3.

The reproducibility obtained with the method according to the invention is excellent.

Besides with the ratio of the concentrations and the gas flows, respectively, the ratio of the etching rates can also be controlled with the temperature. Conversely, for obtaining the same ratio of the etching rates at a different temperature, the concentrations and the gas flows, respectively, must be adapted accordingly.

Of course the invention is not restricted to the Examples described.

For example, MOS transistors having polysilicon gate eletrodes can be manufactured by means of the method according to the invention. In addition to semiconductor devices, piezo-electric devices or integrated magnetic heads can also be manufactured by means of the method.

In addition to bodies consisting of a substrate and a layer to be etched, homogeneous bodies can also be etched, for example, to obtain mesa's. Furthermore the method is suitable for etching metal layers.

What is claimed is:

1. A method of manufacturing a device with etch patterns of predetermined dimensions comprising
   providing a body including an underlying substrate and a surface layer having a thickness D,
   covering portions of said surface layer with a photolacquer mask having a thickness d, said covered portions having dimensions exceeding predetermined etch pattern dimensions by a uniform width b,
   plasma etching uncovered portions of said surface layer and said photolacquer mask to obtain said predetermined pattern of dimensions at said underlying substrate by laterally etching said photolacquer mask at a faster rate than said surface layer, thereby obtaining an etch profile with an inclined side having an angle $\alpha$ with said underlying substrate, wherein said uniform width b is at least equal to D tan $\alpha$, and said thickness d is at least equal to $2D/\sin 2\alpha$.

2. A method according to claim 1, wherein any remaining photolacquer mask after said etching step is removed by dissolving under changed reaction conditions.

3. A method according to claim 1, wherein said plasma etching step is carried out in a gas atmosphere of oxygen and a halogen, and relative etching rates of said photolacquer mask and said surface layer are controlled by changing the ratio of concentrations of said oxygen and halogen in said gas atmosphere.

4. A method according to claim 1, wherein relative etching rates of said photolacquer mask and said surface layer are controlled by varying temperature of the plasma.

* * * * *